(12) United States Patent
Shimada et al.

(10) Patent No.: US 8,859,411 B2
(45) Date of Patent: Oct. 14, 2014

(54) METHOD FOR PRODUCING TRANSISTOR

(75) Inventors: Kenji Shimada, Tokyo (JP); Hiroshi Matsunaga, Tokyo (JP); Kojiro Abe, Chiba (JP); Kenji Yamada, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 13/817,699

(22) PCT Filed: Jul. 26, 2011

(86) PCT No.: PCT/JP2011/066996
§ 371 (c)(1),
(2), (4) Date: Apr. 17, 2013

(87) PCT Pub. No.: WO2012/023387
PCT Pub. Date: Feb. 23, 2012

(65) Prior Publication Data
US 2013/0196497 A1 Aug. 1, 2013

(30) Foreign Application Priority Data

Aug. 20, 2010 (JP) .................................. 2010-184999
Sep. 21, 2010 (JP) .................................. 2010-210827

(51) Int. Cl.
*H01L 29/76* (2006.01)
*H01L 21/28* (2006.01)
*C09K 13/08* (2006.01)
*H01L 21/8238* (2006.01)
*H01L 21/02* (2006.01)
*H01L 21/8234* (2006.01)
*H01L 29/66* (2006.01)
*H01L 21/311* (2006.01)
*H01L 29/40* (2006.01)
*H01L 21/3213* (2006.01)
*C09K 13/06* (2006.01)

(52) U.S. Cl.
CPC .............. *H01L 29/401* (2013.01); *C09K 13/08* (2013.01); *H01L 21/823842* (2013.01); *H01L 21/02068* (2013.01); *H01L 21/82345* (2013.01); *H01L 29/66545* (2013.01); *H01L 21/31111* (2013.01); *H01L 21/28079* (2013.01); *H01L 21/32134* (2013.01); *C09K 13/06* (2013.01)
USPC .......................................... 438/585; 438/702

(58) Field of Classification Search
None
See application file for complete search history.

(56) References Cited

U.S. PATENT DOCUMENTS 6,777,380 B2 * 8/2004 Small et al. .................... 510/176
(Continued)

FOREIGN PATENT DOCUMENTS

JP  3 219625  9/1991
(Continued)

OTHER PUBLICATIONS

"Applied Physics," vol. 76, No. 9, pp. 1006 to 1012, (2007).
(Continued)

*Primary Examiner* — Zandra Smith
*Assistant Examiner* — Pamela E Perkins
(74) *Attorney, Agent, or Firm* — Oblon, Spivak, McClelland, Maier & Neustadt, L.L.P.

(57) ABSTRACT

According to the present invention, there is provided a process for producing a transistor having a high precision and a high quality with a high yield by selectively etching a natural silicon oxide film, and further by selectively etching a dummy gate made of silicon. The present invention relates to a process for producing a transistor using a structural body which includes a substrate, and a dummy gate laminate formed by laminating at least a high dielectric material film and a dummy gate made of silicon having a natural silicon oxide film on a surface thereof, a side wall disposed to cover a side surface of the laminate and an interlayer insulating film disposed to cover the side wall which are provided on the substrate, said process including an etching step using a specific etching solution and thereby replacing the dummy gate with an aluminum metal gate.

16 Claims, 1 Drawing Sheet

(56) References Cited

U.S. PATENT DOCUMENTS

| | | |
|---|---|---|
| 7,316,949 B2 | 1/2008 | Doczy et al. |
| 2001/0041462 A1* | 11/2001 | Kashiwagi et al. ........... 438/787 |
| 2002/0037820 A1 | 3/2002 | Small et al. |
| 2004/0142546 A1 | 7/2004 | Kudo et al. |
| 2005/0202987 A1 | 9/2005 | Small et al. |
| 2006/0035427 A1 | 2/2006 | Kudo et al. |
| 2008/0044990 A1 | 2/2008 | Lee |
| 2010/0059828 A1 | 3/2010 | Kudo et al. |
| 2012/0108046 A1* | 5/2012 | Lin et al. ....................... 438/585 |

FOREIGN PATENT DOCUMENTS

| | | |
|---|---|---|
| JP | 4 48633 | 2/1992 |
| JP | 4 370932 | 12/1992 |
| JP | 9 17766 | 1/1997 |
| JP | 9 252114 | 9/1997 |
| JP | 10 189722 | 7/1998 |
| JP | 2002 359369 | 12/2002 |
| JP | 2004 502980 | 1/2004 |
| JP | 2004 87960 | 3/2004 |
| JP | 2004 152862 | 5/2004 |
| JP | 2004 221226 | 8/2004 |
| JP | 2005 229053 | 8/2005 |
| JP | 2006 8932 | 1/2006 |
| JP | 2007 214456 | 8/2007 |
| JP | 2008 47898 | 2/2008 |
| JP | 2009 152342 | 7/2009 |

OTHER PUBLICATIONS

"Complete Collection of Micro-Machine/MEMS Technologies," MEMS Technology Outlook, p. 111, (2003).

International Search Report Issued Aug. 23, 2011 in PCT/JP11/66996 Filed Jul. 26, 2011.

* cited by examiner

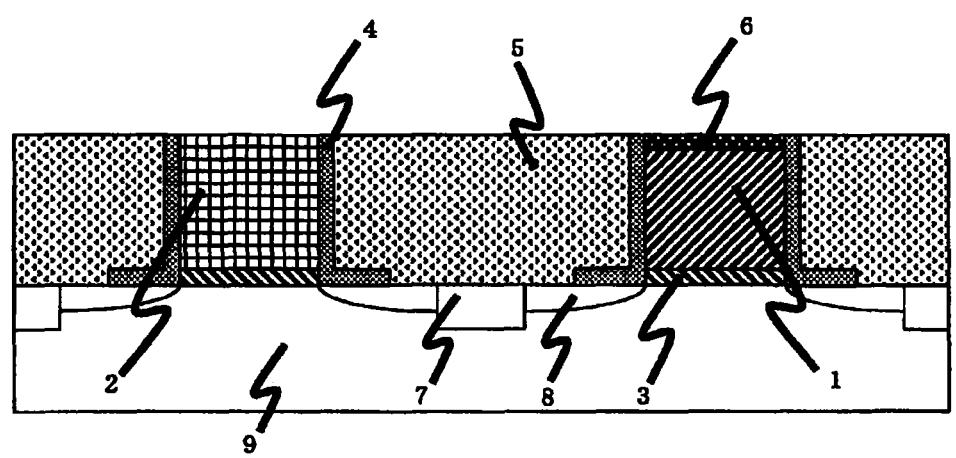

METHOD FOR PRODUCING TRANSISTOR

CROSS REFERENCE TO RELATED APPLICATIONS

The present application is a 35 U.S.C. §371 national stage patent application of International patent application PCT/JP2011/066996, filed on Jul. 26, 2011, published as WO 2012/023387 on Feb. 23, 2012, the text of which is incorporated by reference, and claims the benefit of the filing date of JP application no. 2010-184999, filed on Aug. 20, 2010, and JP application no. 2010-210827, filed on Sep. 21, 2010, the text of which are also incorporated by reference.

TECHNICAL FIELD

The present invention relates to a process for producing a transistor including a laminate formed by laminating at least a high dielectric material film and an aluminum metal gate which is obtained by selectively removing a natural silicon oxide film formed on a surface of silicon by contact of the silicon with air, and also relates to a process for producing a transistor including a laminate formed by laminating at least a high dielectric material film and an aluminum metal gate which is obtained by further selectively removing the silicon.

BACKGROUND ART

Hitherto, semiconductors have been continuously improved in performance, costs and power consumption by reduction of a gate length and a gate thickness of transistors, i.e., so-called micronization thereof. However, if it is intended to achieve the micronization of transistors as recently required, a gate thickness of a conventional gate insulating film using silicon oxide becomes excessively small, so that a leakage current owing to a tunnel current increases, and power consumption becomes large. In addition, in recent years, there is an increasing demand for mobile equipments using semiconductor devices such as mobile phones, notebook type personal computers and potable music players. In this case, a power supply for these mobile equipments has been frequently relied upon rechargeable batteries. Therefore, it has been required that the semiconductor devices used in the mobile equipments have a low power consumption to realize long-term use thereof. In consequence, for the purpose of reducing a leakage current during a stand-by state of the equipments, there has been proposed the technique in which as combination of an insulating material and a gate electrode as constituents of a transistor, combination of a high dielectric material and a metal gate is used in place of the conventional combination of silicone oxide and polysilicon. In the conventional technique, aluminum is selectively used as one of metals for the metal gate (Patent Document 1).

There have been conventionally proposed various methods for producing the high dielectric material and the metal gate. As one of the conventional methods, there has been proposed a so-called gate-last method in which after producing a transistor from combination of a high dielectric material and a polysilicon, the polysilicon is removed to replace it with a metal gate (Non-Patent Document 1). In FIG. 1, there is shown a schematic sectional view of a part of a transistor before removing a polysilicon from a semiconductor device using a high dielectric material. In order to remove the polysilicon by etching, there may be used an alkaline solution. The polysilicon is usually exposed to an atmospheric air before subjected to the etching, so that a natural silicon oxide film is produced on a surface of the polysilicon. However, it is not possible to remove the natural silicon oxide film thus produced using the alkaline solution. In addition, around the polysilicon, there are present aluminum, an interlayer insulating film and a side wall as portions which should not be removed by the etching. For these reasons, there is a demand for techniques of removing a natural silicon oxide film without removal of aluminum, an interlayer insulating film and a side wall before etching the polysilicon with an alkaline solution.

Successively, it is necessary to etch the polysilicon thus exposed. Further, the high dielectric material exposed by etching the polysilicon is also the portion which must not be removed by etching. For these reasons, it is required to provide a technique of etching the polysilicon exposed by removing the natural silicon oxide film without removing the aluminum, interlayer insulating film, side wall and high dielectric material by the etching.

As a technique of removing a natural silicon oxide film by etching, there has been proposed the technique in which a natural oxide film of a polysilicon is removed with diluted hydrofluoric acid, and then a uniform chemical oxide film is formed thereon (Patent Document 2). However, in this technique, aluminum is also etched. Therefore, the technique is not applicable to the above selective etching procedure (refer to Comparative Examples 1-1 and 2-1).

As a technique of selectively etching a natural silicon oxide film and a thermal oxide film, there has been proposed the technique in which a natural silicon oxide film on a substrate is removed by introducing a mixture of a vapor of a hydrofluoric acid aqueous solution and a vapor of a diluting solvent such as 2-propanol into a reaction chamber evacuated to a vacuum pressure (Patent Document 3). However, since aluminum is etched by hydrogen fluoride, the above technique has failed to obtain the semiconductor as desired. In addition, in the above technique, the natural silicon oxide film and the thermal oxide film are respectively etched by utilizing the difference in etching initiation time therebetween. More specifically, the above technique substantially relates to a method of etching the thermal oxide film. Therefore, when using the above technique, it is required to very strictly control an etching treatment time of the respective oxide films, which will result in difficulty in use of the technique.

In addition, as a technique of selectively etching a natural silicon oxide film and a thermal oxide film, there has also been proposed the technique in which the oxide films are subjected to heat treatment at a temperature of from 900 to 1050° C. in a hydrogen atmosphere to remove the natural silicon oxide film (Patent Document 4). One feature of the method of removing a polysilicon to replace the polysilicon with a metal gate resides in that the heat treatment is carried out while controlling an impurity region of source and drain with a high accuracy, so that an additional heat treatment is no longer required, and diffusion of impurities can be caused as designed. However, in this technique, when the natural silicon oxide film is removed, unexpected diffusion of impurities tends to occur owing to the heat treatment, which will result in failure to attain properties as desired.

As a technique of etching, a natural silicon oxide film, there has been proposed the dry-etching technique using a fluorine-based gas (Patent Document 5). However, upon the dry-etching process using a fluorine-based gas, an interlayer insulating film also tends to be undesirably etched, which will result in failure to obtain a semiconductor as desired.

In consequence, it is required to provide a process for producing a transistor including a laminate formed by laminating at least a high dielectric material film and an aluminum metal gate in which a natural silicon oxide film is selectively removed by etching without etching aluminum, an interlayer insulating film and a side wall.

As a method of etching a polysilicon, there is also known the method of subjecting a polysilicon to dry etching (Patent Document 1). However, since aluminum and an interlayer insulating film are also etched in the dry etching process, it is necessary to provide a protective film such as a photoresist on the aluminum and interlayer insulating film. If such a protective film is formed, the production process tends to become complicated, so that there tend to arise the problems such as poor yield and increase in production costs. In addition, an ashing treatment required to remove the photoresist tends to cause damage to the aluminum and interlayer insulating film, which tends to cause a risk of deteriorating a performance of transistors. Also, in general, for the purpose of preventing generation of fine silicon residues, the silicon is subjected to so-called overetching in which the etching is carried out for a longer period of time than an etching treatment time calculated from an etching amount of silicon per unit time (hereinafter referred to as an "etch rate"). In the dry-etching process, a high dielectric material exposed after etching the silicon tends to be etched or tends to be deteriorated in quality when subjected to the overetching, resulting in deterioration in performance of transistors.

As a cleaning solution used upon etching silicon by a wet etching method, there are known various alkaline cleaning solutions (Non-Patent Document 2). However, these cleaning solutions tend to etch not only the polysilicon but also aluminum (refer to Comparative Examples 2-6).

As a technique of etching silicon without etching aluminum, there has been proposed the etching solution for anisotropic etching of silicon which is prepared by dissolving silicon in tetramethyl ammonium hydroxide (Patent Document 6). However, in this technique, the etching solution must be used at an elevated temperature. Therefore, when the above technique is carried out using a sheet cleaning apparatus for cleaning a silicon wafer one by one which has been recently used usually in production of semiconductors to suppress generation of particles in a wet etching method, it is not possible to attain a stable etching capability. If the etching is conducted at a temperature at which the sheet cleaning apparatus is usable, the etch rate of silicon tends to be excessively low. Thus, the above technique is not applicable to etching of silicon in a step of forming a transistor including a high dielectric material and a metal gate. In addition, in the above technique, precipitates are generated at a reduced temperature. For this reason, the technique is not applicable to a step of forming a transistor portion of semiconductors in which even fine particle residues are not allowed to remain (refer to Comparative Example 2-7).

As an etching agent composition capable of selectively etching silicon only by anisotropic etching thereof without etching aluminum or aluminum alloys, there has been proposed the alkali-based etching agent composition prepared by adding a reducing compound and an anticorrosive agent to an alkali aqueous solution (Patent Document 7). However, in this technique, since an etch rate of aluminum is excessively high, the technique is not applicable to etching of silicon in a step of forming a transistor including a high dielectric material and a metal gate (refer to Comparative Example 2-8).

As a technique for removing chlorine while suppressing etching of aluminum, there has been proposed the aqueous solution containing quaternary ammonium hydroxide, and a sugar or a sugar alcohol (Patent Document 8). However, the technique described in Patent Document 8 relates to the method of preventing etching of aluminum from the viewpoint of removal of chlorine, and therefore fails to specify a silicon etching capability of the alkaline stripping solution. More specifically, the technique described in Patent Document 8 is concerned with a technical concept which is quite different from that of the present invention which aims at etching silicon without etching an aluminum film. Further, the aqueous solution described in Patent Document 8 which has an excessively low silicon etch rate is not usable in etching of silicon in the step of forming a transistor including a high dielectric material and a metal gate as aimed by the present invention (refer to Comparative Examples 2-9).

There has also been proposed the stripping solution which is capable of suppressing etching of aluminum and reducing an adhesion strength of an adhesive film (Patent Document 9). However, in Patent Document 9, etching of aluminum with the alkaline stripping solution proposed therein is prevented from such a viewpoint that its capability of reducing an adhesion strength of the adhesive film is not inhibited. Thus, Patent Document 9 fails to describe a silicon etching capability of the alkaline stripping solution. Therefore, the technique described in Patent Document 9 is different from that of the present invention which aims at etching silicon without etching an aluminum film. Further, in Patent Document 9, it is described that the stripping solution used therein is not particularly limited as long as it is in the form of an alkaline solution. However, alkaline compounds capable of etching silicon are limited to specific compounds. Thus, the compounds suitably used in the present invention are not easily suggested from the descriptions of the Patent Document 9 (refer to Comparative Examples 2-10).

As a technique of suppressing etching of aluminum and removing a polyimide orientation film, there has been proposed the aqueous solution containing quaternary ammonium hydroxide, trialkylamine, and an alcohol or an alkyl ether (Patent Document 10). However, the cleaning solution described in Patent Document 10 has a low silicon etching capability and therefore is unsuitable for achieving the object as aimed by the present invention (refer to Comparative Examples 2 to 11).

In consequence, it has been intensively demanded to provide a process for producing a transistor including a laminate formed by laminating at least a high dielectric material film and an aluminum metal gate which is capable of selectively removing a natural silicon oxide film without etching aluminum, an interlayer insulating film and a side wall, and further which is capable of selectively removing silicon without etching aluminum, an interlayer insulating film and a side wall as well as the high dielectric material film.

PRIOR ART DOCUMENTS

Patent Documents

Patent Document 1: U.S. Pat. No. 7,316,949
Patent Document 2: JP 2004-152862A
Patent Document 3: JP 9-17766A
Patent Document 4: JP 2004-87960A
Patent Document 5: JP 3-219625A
Patent Document 6: JP 4-370932A
Patent Document 7: JP 2007-214456A
Patent Document 8: JP 4-48633A
Patent Document 9: JP 2005-229053A
Patent Document 10: JP 2006-8932A Non-Patent Documents Non-Patent Document 1: "Applied Physics", 76, 9, 2007, p. 1006
Non-Patent Document 2: "Complete Collection of Micro-Machine/MEMS technologies", 2003, p. 111

BRIEF DESCRIPTION OF THE DRAWING

FIG. 1 is a sectional view of a transistor using a high dielectric material before removing silicon therefrom.

EXPLANATION OF REFERENCE NUMERALS

1: Dummy gate (silicon); 2: Aluminum metal gate; 3: High dielectric material film; 4: Side wall; 5: Interlayer insulating film; 6: Natural silicon oxide film; 7: Isolation; 8: Source/drain; 9: Substrate

DISCLOSURE OF THE INVENTION

Problem to be Solved by the Invention

The present invention has been accomplished under the above circumstances. An object of the present invention is to provide a process for producing a transistor including a laminate formed by laminating at least a high dielectric material film and an aluminum metal gate which is obtained by selectively removing a natural silicon oxide film produced on a surface of silicon by contact of the silicon with air, and also to provide a process for producing a transistor including a laminate formed by laminating at least a high dielectric material film and an aluminum metal gate which is obtained by further selectively removing the silicon.

Means for Solving the Problem

As a result of an earnest study for achieving the above object, the present inventors have found that the above object of the present invention can be achieved by using specific etching solutions for etching a natural silicon oxide film and silicon, respectively. The present invention has been accomplished on the basis of the above finding. That is, the present invention provides the following aspects:

1. A process for producing a transistor using a structural body which includes a substrate, and a dummy gate laminate formed by laminating at least a high dielectric material film and a dummy gate made of silicon having a natural silicon oxide film on a surface thereof, a side wall disposed to cover a side surface of the laminate and an interlayer insulating film disposed to cover the side wall which are provided on the substrate,
said process including the following step (I) and thereby replacing the dummy gate with an aluminum metal gate:
Step (I): etching the natural silicon oxide film with an etching solution containing 0.01 to 8% by weight of a fluorine compound, 20 to 90% by weight of a water-soluble organic solvent and water.
2. The process for producing a transistor as described in the above aspect 1, further including the following step (II) subsequent to the step (I):
Step (II): etching the silicon with an etching solution (II) containing 0.1 to 40% by weight of at least one alkali compound selected from the group consisting of ammonia, a diamine and a polyamine represented by the following general formula (1), 6 to 60% by weight of at least one polyhydric alcohol represented by the following general formula (2) and 40 to 94.9% by weight of water:

wherein m is an integer of 2 to 5; and

wherein n is an integer of 3 to 6.
3. The process for producing a transistor as described in the above aspect 1 or 2, wherein the fluorine compound is at least one compound selected from the group consisting of hydrofluoric acid, ammonium fluoride and acid ammonium fluoride.
4. The process for producing a transistor as described in the above aspect 1 or 2, wherein the water-soluble organic solvent is at least one organic solvent selected from the group consisting of alcohols selected from ethanol, 2-propanol, glycerin, ethylene glycol and diethylene glycol; glycol ethers selected from diethylene glycol monomethyl ether, diethylene glycol monobutyl ether, dipropylene glycol monomethyl ether and dipropylene glycol monopropyl ether; amides selected from N,N-dimethylformamide, N,N-dimethylacetamide and N-methyl-2-pyrrolidone; and dimethyl sulfoxide.
5. The process for producing a transistor as described in the above aspect 1, wherein the etching solution (I) further includes an acid.
6. The process for producing a transistor as described in the above aspect 5, wherein the acid is at least one acid selected from the group consisting of inorganic acids selected from hydrochloric acid, nitric acid, sulfuric acid and phosphoric acid; and organic acids selected from acetic acid, propionic acid, oxalic acid and methanesulfonic acid.
7. The process for producing a transistor as described in the above aspect 5, wherein a concentration of the acid in the etching solution (I) is 5% by weight or less.
8. The process for producing a transistor as described in the above aspect 2, wherein the diamine and the polyamine represented by the general formula (1) which are contained in the etching solution (II) are at least one compound selected from the group consisting of ethylenediamine, 1,2-propanediamine and 1,3-propanediamine, and at least one compound selected from the group consisting of diethylenetriamine and triethylenetetramine, respectively.
9. The process for producing a transistor as described in the above aspect 2, wherein the polyhydric alcohol represented by the general formula (2) which is contained in the etching solution (II) is at least one compound selected from the group consisting of glycerin, meso-erythritol, xylitol and sorbitol.
10. The process for producing a transistor as described in the above aspect 1 or 2, wherein a high dielectric material forming the high dielectric material film is $HfO_2$, HfSiO, HfSiON, HfLaO, HfLaON, HfTiSiON, HfAlSiON, HfZrO or $Al_2O_3$.

Effect of the Invention

According to the present invention, in a process for producing a transistor including a laminate formed of at least a high dielectric material film and an aluminum metal gate by the method in which a dummy gate made of silicon is removed and replaced with the aluminum metal gate, it is possible to selectively remove a natural silicon oxide film formed on a surface of silicon by contact of the silicon with air without etching aluminum, an interlayer insulating film and a side wall, and further selectively remove the silicon without etching the aluminum, interlayer insulating film, side wall and high dielectric material film. As a result, according to the present invention, it is possible to produce a transistor having a high precision and a high quality with a high yield.

PREFERRED EMBODIMENTS FOR CARRYING OUT THE INVENTION

The process for producing a transistor according to the present invention is carried out using a structural body which includes a substrate, and a dummy gate laminate formed by laminating at least a high dielectric material film and a dummy gate made of silicon having a natural silicon oxide film on a surface thereof, a side wall disposed to cover a side surface of the laminate and an interlayer insulating film disposed to cover the side wall which are provided on the substrate, and includes at least a step (I) of etching the natural silicon oxide film with an etching solution containing 001 to 8% by weight of a fluorine compound, 20 to 90% by weight of a water-soluble organic solvent and water, and replacing the dummy gate with an aluminum metal gate. The aluminum metal gate as used herein means a metal gate containing metallic aluminum, and is not necessarily formed of 100% of aluminum. From the viewpoint of sufficiently attaining the effects of the present invention, the content of aluminum in the aluminum metal gate is preferably 50% or more. Further, either a whole or a part of the dummy gate may be replaced with the aluminum metal gate. In the present invention, even when aluminum is used only as a part of the transistor, it is possible to exhibit the effect of selectively etching a natural silicon oxide film or silicon forming the dummy gate without etching the aluminum portion.

<<Step (I)>>

The step (I) is a step of treating a structural body including a substrate, and a dummy gate laminate formed of a high dielectric material film and a dummy gate made of silicon having a natural silicon oxide film on a surface thereof, a side wall disposed to cover a side surface of the laminate and an interlayer insulating film disposed to cover the side wall which are provided on the substrate, in which the natural silicon oxide film is etched with a specific etching solution. The step (I) is an essential step in the production process of the present invention. Upon production of transistors, a surface of a silicon material such as polysilicon used as a raw material of the dummy gate is oxidized by contact with air to form a natural silicon oxide film thereon. Therefore, it is required to remove the natural silicon oxide film by etching.

The etching solution (I) used in the step (I) for removing the natural silicon oxide film by etching is an aqueous solution containing 001 to 8% by weight of a fluorine compound, 20 to 90% by weight of a water-soluble organic solvent, and water.

Specific examples of the preferred fluorine compound contained in the etching solution (I) used in the present invention include hydrofluoric acid, ammonium fluoride and acid ammonium fluoride. Among these fluorine compounds, more preferred are ammonium fluoride and acid ammonium fluoride. In the present invention, these fluorine compounds may be used alone or in combination of any two or more thereof.

The concentration of the fluorine compound in the etching solution (I) is required to lie within the range of from 0.01 to 8% by weight, and is preferably in the range of from 0.1 to 5% by weight and more preferably from 0.2 to 2% by weight. When the concentration of the fluorine compound in the etching solution (I) is less then 0.01% by weight, the time required for removal of the natural silicon oxide film tends to be prolonged. When the concentration of the fluorine compound in the etching solution (I) is more then 8% by weight, the interlayer insulating material tends to be undesirably etched.

As the water-soluble organic solvent contained in the etching solution (I) used in the present invention, there are preferably used alcohols, glycol ethers, amides and dimethyl sulfoxide. Specific examples of the alcohols include ethanol, 2-propanol, glycerin, ethylene glycol and diethylene glycol. Specific examples of the glycol ethers include diethylene glycol monomethyl ether, diethylene glycol monobutyl ether, dipropylene glycol monomethyl ether and dipropylene glycol monopropyl ether. Specific examples of the amides include N,N-dimethylformamide, N,N-dimethylacetamide and N-methyl-2-pyrrolidone. Among these water-soluble organic solvents, preferred are diethylene glycol monomethyl ether, diethylene glycol monobutyl ether, dipropylene glycol monomethyl ether, dipropylene glycol monopropyl ether, N,N-dimethylformamide, N,N-dimethylacetamide and N-methyl-2-pyrrolidone. In the present invention, these water-soluble organic solvents may be used alone or in combination of any two or more thereof.

The concentration of the water-soluble organic solvent in the etching solution (I) is required to lie within the range of from 20 to 90% by weight, and is preferably in the range of from 30 to 80% by weight and more preferably from 40 to 80% by weight. When the concentration of the water-soluble organic solvent in the etching solution (I) is less than 20% by weight, aluminum tends to be undesirably etched. When the concentration of the water-soluble organic solvent in the etching solution (I) is more than 90% by weight, the interlayer insulating material tends to be undesirably etched.

The etching solution (I) used in the present invention may also contain an acid. The acid contained in the etching solution (I) used in the present invention may be either an inorganic acid or an organic acid. Specific examples of the preferred inorganic acid include hydrochloric acid, nitric acid, sulfuric acid and phosphoric acid. Specific examples of the preferred organic acid include acetic acid, propionic acid, oxalic acid and methanesulfonic acid.

In the present invention, these acids may be used alone or in combination of any two or more thereof. The concentration of the acid in the etching solution (I) is 5% by weight or less, preferably 3% by weight or less and more preferably 2% by weight or less. When the concentration of the acid in the etching solution (I) is 5% by weight or less, the aluminum and interlayer insulating material can be prevented from being etched.

The etching solution (I) used for etching the natural silicon oxide film in the present invention may further contain various additives ordinarily used in conventional etching solutions such as a surfactant and an anticorrosive agent, unless the addition of these additives causes any adverse influence on the objects and effects of the present invention.

The etching of the step (I) is usually conducted at a temperature of from about 10 to about 80° C., preferably from 20 to 60° C. and more preferably from 20 to 50° C. The etching temperature may be appropriately determined according to etching conditions or material of the substrate used.

The treating time upon conducting the step (I) is usually in the range of from about 0.1 to 20 min, preferably from 0.2 to 10 min, more preferably from 0.3 to 5 min and still more preferably from 0.3 to 3 min, and may be appropriately determined according to etching conditions or material of the substrate used.

In the step (I), an ultrasonic wave may be used in combination, if required.

In addition, a rinsing solution used after removing the natural silicon oxide film on the substrate according to the production process of the present invention is not necessarily an organic solvent such as alcohols, and water may be satisfactorily used as the rinsing solution.

In the present invention, after the natural silicon oxide film formed on silicon by contact of the silicon with air is etched in the step (I), the silicon is etched with an etching solution usually used for etching silicon, for example, an etching solution containing tetramethyl ammonium hydroxide as an effective component to remove the dummy gate. Next, the step (II) as a preferred form of the step of etching the silicon is explained.

<<Step (II)>>

The process for producing a transistor according to the present invention preferably further includes a step of etching the silicon using a specific etching solution (II) after completion of the step (I). The etching solution (II) used for etching the silicon in the step (II) is an aqueous solution containing 0.1 to 40% by weight of at least one alkali compound selected from the group consisting of ammonia, a diamine and a polyamine represented by the following general formula (1), 5 to 50% by weight of at least one polyhydric alcohol represented by the following general formula (2) and 40 to 94.9% by weight of water:

$$H_2N—(CH_2CH_2NH)_m—H \quad (1)$$

wherein m is an integer of 2 to 5; and

$$H—(CH(OH))_n—H \quad (2)$$

wherein n is an integer of 3 to 6.

The alkali compound used in the present invention serves for etching silicon, and is at least one compound selected from the group consisting of ammonia, a diamine and a polyamine represented by the general formula (1). Examples of the preferred diamine contained in the etching solution (II) used in the present invention include ethylenediamine, 1,2-propanediamine and 1,3-propanediamine. Examples of the preferred polyamine represented by the general formula (1) include diethylenetriamine and triethylenetetramine.

The concentration of the alkali compound in the etching solution (II) is usually from 0.1 to 40% by weight, preferably from 0.2 to 40% by weight and more preferably from 0.3 to 30% by weight.

The polyhydric alcohol contained in the etching solution (II) used in the present invention is at least one compound selected from the group consisting of those compounds represented by the general formula (2). Specific examples of the preferred polyhydric alcohol represented by the general formula (2) include glycerin, meso-erythritol, xylitol and sorbitol.

The concentration of the polyhydric alcohol in the etching solution (II) is usually from 5 to 50% by weight, preferably from 6 to 40% by weight and more preferably from 7 to 30% by weight. When the concentration of the polyhydric alcohol in the etching solution (II) is 5% by weight or more, the resulting etching solution can exhibit a sufficient effect of preventing corrosion of aluminum. On the other hand, when the concentration of the polyhydric alcohol in the etching solution (II) is 50% by weight or less, the resulting etching solution can exhibit a sufficient silicon etching capability The etching solution (II) used for etching silicon in the present invention may further contain various additives ordinarily used in conventional etching solutions such as a surfactant and an anticorrosive agent, unless the addition of these additives causes any adverse influence on the objects and effects of the present invention.

The etching of the step (II) is usually conducted at a temperature of from about 20 to about 80° C., preferably from 20 to 70° C. and more preferably from 20 to 60° C. The etching temperature may be appropriately determined according to etching conditions or material of the substrate used.

The treating time upon conducting the step (II) is usually in the range of from about 0.1 to about 10 min, preferably from 0.2 to 8 min and more preferably from 0.3 to 5 min, and may be appropriately determined according to etching conditions or material of the substrate used.

In the step (II), similarly to the step (I), an ultrasonic wave may be used in combination, if required. In addition, a rinsing solution used after removing etching residues on the substrate according to the production process of the present invention is not necessarily an organic solvent such as alcohols, and water may be satisfactorily used as the rinsing solution.

<<Structural Body>>

In the production process of the present invention, the structural body to be subjected to the etching step (I) includes, on a substrate, a dummy gate laminate formed of a high dielectric material film and a dummy gate made of silicon having a natural silicon oxide film on a surface thereof, a side wall disposed to cover a side surface of the laminate, and an interlayer insulating film disposed to cover the side wall. In FIG. 1, there is shown a sectional view of the structural body to be subjected to the etching step (I) in the production process of the present invention. The structural body shown in FIG. 1 is provided on a substrate 9 with a dummy gate laminate formed by laminating a high dielectric material film 3 and a dummy gate 1 made of silicon having a natural silicon oxide film 6 on a surface thereof, a side wall 4 disposed to cover a side surface of the laminate, and an interlayer insulating film 5 disposed to cover the side wall 4.

As shown in FIG. 1, the structural body may have a portion in which the dummy gate 1 has been already replaced with an aluminum metal gate 2. In addition, in FIG. 1, there are shown a source/drain region 8 and an isolation 7 which may be formed by a suitable method such as ion implantation. The high dielectric material film 3 is usually provided on a surface of the substrate 9 so as to cover a portion between the adjacent source/drain regions 8.

As recognized from FIG. 1, the surface of the dummy gate 1 made of silicon is subjected to natural oxidation owing to contact with air in the process for producing a transistor to thereby form the natural silicon oxide film 6 thereon. In consequence, in the present invention, before etching the dummy gate 1, the natural silicon oxide film 6 is etched in the step (I), whereby it is possible to produce a transistor having a high precision and a high quality with a high yield while preventing damage to respective portions of the transistor.

When etching the natural silicon oxide film 6 in the step (I), the etching solution used in the step (I) comes into contact with the aluminum metal gate 2, the side wall 4 and the interlayer insulating film 5. Therefore, the etching solution is required to have a performance of preventing damage to these portions, i.e., a performance of selectively etching the natural silicon oxide film 6. In the step (II) which may be carried out in the preferred embodiment of the process for producing a transistor according to the present invention, when etching the dummy gate 1 made of silicon, the etching solution used in the step (II) comes into contact with the aluminum metal gate 2, the side wall 4 and the interlayer insulating film 5. Further, as etching of the dummy gate 1 proceeds, the underlying high dielectric material film 3 being present underneath the dummy gate 1 is exposed to outside and therefore the etching solution also comes into contact with the high dielectric material film 3. For this reason, the etching solution used in the step (II) is required to have a performance of preventing damage to these portions, i.e., a performance of selectively etching silicon constituting the dummy gate 1.

In the process for producing a transistor according to the present invention, the above etching solution (I) is used in the step (I), whereas the etching solution (II) is used in the step (II) adopted in the process for producing a transistor according to the preferred embodiment of the present invention. As a result, it is possible to selectively etch the natural silicon oxide film 6 and the dummy gate 1 made of silicon using the etching solutions (I) and (II), respectively, to thereby produce a transistor having a high precision and a high quality with a high yield.

<<Other Steps>>

The process for producing a transistor according to the present invention is not particularly limited to the above specific process as long as the process includes the above step (I). The process for producing a transistor according to the present invention preferably further includes the above step (H). Further, the process for producing a transistor according to one preferred embodiment of the present invention includes sequentially a step (A) of forming a high dielectric material film on a substrate; a step (B) of forming a dummy gate made of silicon on the high dielectric material film to form a laminate containing the high dielectric material film and the dummy gate; a step (C) of forming a side wall to cover a side surface of the laminate; a step (D) of forming an interlayer insulating film to cover the side wall; the above step (I); the above step (II); and a step (E) of forming an aluminum metal gate on the high dielectric material film to form a laminate containing the high dielectric material film and the aluminum metal gate. The steps (A) to (E) are not particularly limited and may be carried out by ordinary methods which may be generally adopted for respective steps in a process for production of transistors.

<<Transistor>>

The transistor obtained by the production process of the present invention includes a substrate 9, and a laminate formed by laminating at least a high dielectric material film 3 and an aluminum metal gate 2, a side wall 4 disposed to cover a side surface of the laminate and an interlayer insulating film 5 disposed to cover the side wall 4 which are provided on the substrate. More specifically, the transistor thus produced has a structure in which the dummy gate 1 in the structural body to be subjected to the etching step (I) in the process for producing a transistor according to the present invention is replaced with the aluminum metal gate. In addition, as shown in FIG. 1, the transistor obtained by the production process of the present invention further includes a source/drain region 8 and an isolation 7, and the high dielectric material film 3 is provided on a surface of the substrate 9 to cover a portion between the adjacent source/drain regions 8.

In the transistor produced by the production process of the present invention, as the material of the substrate 9, there are preferably used silicon, amorphous silicon, polysilicon and glass. As the wiring material for the metal gate, etc., there is used at least aluminum, and there may also be used wiring materials other than aluminum such as, for example, copper, tungsten, titanium-tungsten, aluminum, aluminum alloys, chromium and chromium alloys.

Examples of the preferred material for the interlayer insulating film 5 include silicon oxide films obtained by a high-density plasma chemical vapor deposition method (HDP), tetraethoxy silane (TEOS) and boron phosphor silicate glass (BPSG). Examples of the preferred material for the side wall 4 include silicon nitride (SiN), etc. Examples of the preferred high dielectric material include $HfO_2$, $Al_2O_3$ and materials containing a silicon atom and/or a nitrogen atom and/or a metal such as La, Ti and Zr in addition to $HfO_2$ and $Al_2O_3$. However, the materials used for the interlayer insulating film 5, the side wall 4 and the high dielectric material film 3 are not particularly limited to the above materials.

The transistor obtained by the production process of the present invention may also include portions generally contained in transistors, for example, a barrier layer and an insulating film. Examples of a preferred barrier material forming the barrier layer include titanium, titanium nitride, tantalum and tantalum nitride. Examples of a preferred insulating material forming the insulating film include silicon oxide, silicon nitride, silicon carbide and derivatives of these compounds.

In the laminate formed by laminating the high dielectric material film 3 and the aluminum metal gate 2, there may also be provided an additional metal gate made of a metal material other than the metal forming the aluminum metal gate, as well as a functional layer such as, for example, a characteristic-controlling film. Examples of the preferred semiconductor material used in the present invention include compound semiconductors such as gallium-arsenic, gallium-phosphorus and indium-phosphorus, and oxide semiconductors such as chromium oxide.

The transistor obtained by the production process of the present invention has a high precision and a high quality.

EXAMPLES

The present invention will be described in more detail below by referring to the following examples. It should be noted, however, that the following examples are only illustrative and not intended to limit the invention thereto.

1-1. Evaluation Method

SEM Observation: Observed using an ultrahigh resolution field emission type scanning electron microscope "5-6600" available from Hitachi Hi-Technologies Corp., and the observation results were evaluated according to the following ratings.

Determination:

(Evaluation Ratings for Removal of Natural Silicon Oxide Film)

◯: Natural silicon oxide film 6 was completely removed.

x: Natural silicon oxide film 6 was not removed.

(Evaluation Ratings for Damage to Al)

⊚: No change in condition of aluminum metal gate 2 occurred as compared to that before being cleaned.

◯: Slight roughness occurred on a surface of aluminum metal gate 2.

x: Large holes were formed in aluminum metal gate 2.

(Evaluation Ratings for Damage to Interlayer Insulating Film)

⊚: No change in condition of interlayer insulating film 5 occurred as compared to that before being cleaned.

◯: Slight depression occurred on interlayer insulating film 5.

x: Large depression occurred on interlayer insulating film 6.

Examples 1-1 to 1-13

Using a silicon wafer as the substrate 9, there were prepared structural bodies each having a section as shown in FIG. 1 in which a transistor structure was formed on the silicon wafer. The interlayer insulating film 6 was a silicon oxide film deposited by a high-density plasma (HDP) CVD method. The side wall 4 was formed of silicon nitride. In order to remove the natural silicon oxide film 6 being present on a surface of silicon forming the dummy gate 1, the structural bodies thus prepared were immersed in the respective etching solutions (I) as shown in Table 1-2 in the respective Examples (as to compositions of the respective etching solutions (I), refer to Table 1-1) at a predetermined temperature for a predetermined time (etching step (I)), and then subjected to rinsing with ultrapure water and drying by injecting a dry nitrogen gas thereto. After being treated with the respective liquid chemicals, a section of the respective transistors was subjected to SEM observation to examine the conditions of the aluminum metal gate 2, the interlayer insulating film 6 and the side wall 4. As a result, there was present no case where the side wall 4 was etched. Therefore, the condition of the side wall 4 was not subsequently described.

After conducting the above procedures, the resulting structural bodies were immersed in an aqueous solution containing 6% by weight of tetramethyl ammonium hydroxide and 95% by weight of water at 80° C. for 2 min, and then subjected to rinsing with ultrapure water and drying by injecting a dry nitrogen gas thereto.

Thereafter, a section of the respective transistors was subjected to SEM observation to examine the condition of silicon forming the dummy gate 1. In the case where the natural silicon oxide film 6 was etched when immersed in the etching solutions (I) as shown in Table 1-1, the silicon forming the dummy gate 1 was etched with the tetramethyl ammonium hydroxide aqueous solution in the treatment subsequent to the immersion treatment. However, if the natural silicon oxide film 6 was etched only to an insufficient extent when immersed in the etching solutions (I) as shown in Table 1-1, the silicon forming the dummy gate 1 was also insufficiently etched with the tetramethyl ammonium hydroxide aqueous solution in the subsequent treatment. Therefore, when observing the etching condition of the silicon forming the dummy gate 1 by SEM, it was possible to determine an etching capability of the etching solutions (I) as shown in Table 1-1 for etching the natural silicon oxide film 6.

As shown in Table 1-2, it was confirmed that in Examples 1-1 to 1-13 to which the cleaning method of the present invention was applied, the natural silicon oxide film 6 formed on a surface of the silicon forming the dummy gate 1 was well etched while preventing the aluminum metal gate 2 and the interlayer insulating film 5 from being etched.

Comparative Example 1-1

The same evaluation procedure as in Example 1-1 was carried out except for using an etching solution in the form of a 0.01 wt % hydrofluoric acid aqueous solution (etching solution 1-N as shown in Table 1-3) as described in Patent Document 2. As a result, as shown in Table 1-4, although no change in condition of the interlayer insulating film 5 occurred, the natural silicon oxide film 6 was not removed by etching, and large holes were formed in the aluminum metal gate 2. From these results, it was confirmed that the process described in Patent Document 2 was inapplicable to removal of the natural silicon oxide film formed on a surface of silicon in the process for producing the transistor containing the high dielectric material and the aluminum-containing metal gate as aimed by the present invention.

Comparative Example 1-2

The same evaluation procedure as in Example 1-1 was carried out except for using an etching solution in the form of a 80 wt % 2-propanol aqueous solution (etching solution 1-O as shown in Table 1-3). As a result, as shown in Table 1-4, although no change in conditions of the interlayer insulating film 5 and the aluminum metal gate 2 occurred, the natural silicon oxide film 6 was not removed by etching. From these results, it was confirmed that the organic solvent aqueous solution was inapplicable to removal of the natural silicon oxide film formed on a surface of silicon in the process for producing the transistor containing the high dielectric material and the aluminum-containing metal gate as aimed by the present invention.

Comparative Example 1-3

The same evaluation procedure as in Example 1-1 was carried out except for using an etching solution in the form of a 1 wt % sulfuric acid aqueous solution (etching solution 1-P as shown in Table 1-3). As a result, as shown in Table 1-4, although no change in condition of the interlayer insulating film 5 occurred, the natural silicon oxide film 6 was not removed by etching, and large holes were formed in the aluminum metal gate 2. From these results, it was confirmed that the acid aqueous solution was inapplicable to removal of the natural silicon oxide film formed on a surface of silicon in the process for producing the transistor containing the high dielectric material and the aluminum-containing metal gate as aimed by the present invention.

Comparative Example 1-4

The same evaluation procedure as in Example 1-1 was carried out except for using an etching solution in the form of an aqueous solution containing 1% by weight of ammonium fluoride and 0.5% by weight of acetic acid (etching solution 1-Q as shown in Table 1-3). As a result, as shown in Table 1-4, although the natural silicon oxide film 6 was removed by etching, large depression was formed on the interlayer insulating film 5, and large holes were formed in the aluminum metal gate 2. From these results, it was confirmed that the aqueous solution containing the fluorine compound and the acid was inapplicable to removal of the natural silicon oxide film formed on a surface of silicon in the process for producing the transistor containing the high dielectric material and the aluminum-containing metal gate as aimed by the present invention.

Comparative Example 1-5

The same evaluation procedure as in Example 1-1 was carried out except for using an etching solution in the form of an aqueous solution containing 60% by weight of N-methyl-2-pyrrolidone and 0.5% by weight of methanesulfonic acid (etching solution 1-R as shown in Table 1-3). As a result, as shown in Table 1-4, although no change in condition of the interlayer insulating film 5 occurred, the natural silicon oxide film 6 was not removed by etching, and large holes were formed in the aluminum metal gate 2. From these results, it was confirmed that the organic solvent/acid-containing aqueous solution was inapplicable to removal of the natural silicon oxide film formed on a surface of silicon in the process for producing the transistor containing the high dielectric material and the aluminum-containing metal gate as aimed by the present invention.

TABLE 1-1

| Etching solution (I) | Fluorine compound Kind | Conc. (wt %) | Water-soluble organic solvent 1 Kind | Conc. (wt %) | Water-soluble organic solvent 2 Kind | Conc. (wt %) | Acid Kind | Conc. (wt %) | Water Conc. (wt %) |
|---|---|---|---|---|---|---|---|---|---|
| 1-A | HFA[*1) | 0.05 | Ethanol | 80 | Not added | | Not added | | 19.95 |
| 1-B | NH4F[*2) | 8 | 2-Propanol | 20 | Not added | | Not added | | 72 |
| 1-C | NH4F[*2) | 5 | DEG[*4) | 30 | DPME[*9) | 20 | Not added | | 45 |
| 1-D | NH4F[*2) | 0.01 | DGME[*5) | 90 | Not added | | Acetic acid | 5 | 4.99 |
| 1-E | NH4F[*2) | 1 | DMA[*6) | 60 | DGBE[*10) | 10 | Not added | | 29 |
| 1-F | Acid NH4F[*3) | 0.1 | DMF[*7) | 50 | DPPE[*11) | 20 | Not added | | 29.9 |
| 1-G | NH4F[*2) | 0.5 | DMA[*6) | 50 | EG[*12) | 10 | Phosphoric acid | 3 | 36.5 |
| 1-H | NH4F[*2) | 0.5 | DMA[*6) | 60 | Not added | | Hydrochloric acid | 0.05 | 39.5 |
| 1-I | NH4F[*2) | 1 | DMSO[*8) | 70 | Not added | | Sulfuric acid | 1 | 28 |
| 1-J | NH4F[*2) | 1 | DMF[*7) | 70 | Not added | | Methane-sulfonic acid | 0.05 | 28.95 |
| 1-K | NH4F[*2) | 0.5 | DMA[*6) | 60 | Not added | | Nitric acid | 0.05 | 39.45 |
| 1-L | NH4F[*2) | 0.5 | N-methyl-2-pyrrolidone | 60 | Not added | | Propionic acid | 0.05 | 39.45 |
| 1-M | NH4F[*2) | 0.5 | DMF[*7) | 60 | Not added | | Oxalic acid | 0.05 | 39.45 |

Note

HFA[*1): Hydrofluoric acid; NH4F[*2): Ammonium fluoride; Acid NH4F[*3): Acid ammonium fluoride; DEG[*4): Diethylene glycol; DGME[*5): Diethylene glycol monomethyl ether; DMA[*6): N,N-dimethylacetamide; DMF[*7): N,N-dimethylformamide; DMSO[*8): Dimethyl sulfoxide; DPME[*9): Dipropylene glycol monomethyl ether; DGBE[*10): Diethylene glycol monobutyl ether; DPPE[*11): Dipropylene glycol monopropyl ether; EG[*12): Ethylene glycol

TABLE 1-2

| Examples | Etching solution (I) | Temperature/ °C. | Immersion time/min | Removal of natural silicon oxide film | Damage to Al | Damage to interlayer insulating film |
|---|---|---|---|---|---|---|
| 1-1 | 1-A | 25 | 5 | ○ | ◉ | ◉ |
| 1-2 | 1-B | 25 | 2 | ○ | ○ | ◉ |
| 1-3 | 1-C | 25 | 2 | ○ | ◉ | ◉ |
| 1-4 | 1-D | 25 | 5 | ○ | ◉ | ○ |
| 1-5 | 1-E | 25 | 2 | ○ | ◉ | ◉ |
| 1-6 | 1-F | 25 | 2 | ○ | ◉ | ◉ |
| 1-7 | 1-G | 25 | 2 | ○ | ◉ | ◉ |
| 1-8 | 1-H | 25 | 2 | ○ | ◉ | ◉ |
| 1-9 | 1-I | 25 | 2 | ○ | ◉ | ◉ |
| 1-10 | 1-J | 25 | 2 | ○ | ◉ | ◉ |
| 1-11 | 1-K | 25 | 2 | ○ | ◉ | ◉ |
| 1-12 | 1-L | 25 | 2 | ○ | ◉ | ◉ |
| 1-13 | 1-M | 25 | 2 | ○ | ◉ | ◉ |

TABLE 1-3

| Etching solution | Fluorine compound Kind | Conc. (wt %) | Water-soluble organic solvent 1 Kind | Conc. (wt %) | Acid Kind | Conc. (wt %) | Water Conc. (wt %) |
|---|---|---|---|---|---|---|---|
| 1-N | Hydrofluoric acid | 0.01 | Not added | | Not added | | 99.99 |
| 1-O | Not added | | 2-Propanol | 80 | Not added | | 20 |
| 1-P | Not added | | Not added | | Sulfuric acid | 1 | 99 |
| 1-Q | Ammonium fluoride | 1 | Not added | | Acetic acid | 0.5 | 98.5 |
| 1-R | Not added | | N-methyl-2-pyrrolidone | 60 | Methanesulfonic acid | 0.5 | 39.5 |

TABLE 1-4

| Comparative Examples | Etching solution (I) | Temperature/ °C. | Immersion time/min | Removal of natural silicon oxide film | Damage to Al | Damage to interlayer insulating film |
|---|---|---|---|---|---|---|
| 1-1 | 1-N | 25 | 2 | X | X | ◉ |
| 1-2 | 1-O | 25 | 2 | X | ◉ | ◉ |
| 1-3 | 1-P | 25 | 2 | X | X | ◉ |
| 1-4 | 1-Q | 25 | 2 | ○ | X | X |
| 1-5 | 1-R | 25 | 2 | X | X | ◉ |

2-1. Evaluation Method

Measuring Equipments:

SEM observation: Observed using an ultrahigh resolution field emission type scanning electron microscope "S-5500" available from Hitachi Hi-Technologies Corp.

FIB Fabrication: Fabricated using a focused ion beam fabrication device "FB-2100" available from Hitachi Hi-Technologies Corp.

STEM Observation: Observed using a scanning transmission electron microscope "HD-2300" available from Hitachi Hi-Technologies Corp.

Determination:

(Etching Condition of Dummy Gate 1 Made of Silicon)

◯: Dummy Gate 1 was completely etched.

x: Dummy Gate 1 was insufficiently etched.

(Evaluation Ratings for Damage to Al)

⊚: No change in condition of aluminum metal gate 2 occurred as compared to that before being cleaned.

◯: Slight roughness occurred on a surface of aluminum metal gate 2.

x: Large holes were formed in aluminum metal gate 2.

(Evaluation Ratings for Damage to Interlayer Insulating Film)

⊚: No change in condition of interlayer insulating film 5 occurred as compared to that before being cleaned.

◯: Slight depression occurred on interlayer insulating film 5.

x: Large depression occurred on interlayer insulating film 5.

Examples 2-1 to 2-72

Using a silicon wafer as the substrate 9, there were prepared structural bodies each having a section as shown in FIG. 1 in which respective transistor structures represented by 2-1A to 2-1I in Table 2-1 were formed on the silicon wafer. In the respective Examples in which the respective structural bodies as shown in Table 2-4 were used, in order to remove the natural silicon oxide film 6 being present on a surface of the dummy gate 1 made of silicon, the structural bodies thus prepared were immersed in the respective etching solutions (I) as shown in Table 2-4 (as to compositions of the respective etching solutions (I), refer to Table 2-2) at a predetermined temperature for a predetermined time (etching step (I)), and then subjected to rinsing with ultrapure water and drying by injecting a dry nitrogen gas thereto. After the above procedure, the structural bodies were successively immersed in the respective etching solutions (II) as shown in Table 2-4 (as to compositions of the respective etching solutions (II), refer to Table 2-3) at a predetermined temperature for a predetermined time (etching step (II)), and then subjected to rinsing with ultrapure water and drying by injecting a dry nitrogen gas thereto. After being treated with the above liquid chemicals, a section of the respective transistors was subjected to SEM observation to determine the conditions of the dummy gate 1 made of silicon, the aluminum metal gate 2, the side wall 4 and the interlayer insulating film 5.

The high dielectric material 3 was covered with the dummy gate 1 made of silicon. Therefore, when the dummy gate 1 made of silicon was removed using the etching solution, the high dielectric material 3 was allowed to come into contact with the etching solution. Thus, when observing the condition of the high dielectric material 3, it was possible to determine whether or not any damage to the high dielectric material 3 by the etching solution was caused. In consequence, only in the case where the dummy gate 1 made of silicon was removed by etching, the transistor obtained after the etching was subjected to thin film fabrication using FIB to form a thin film having a thickness of 200 nm or less, and the resulting thin film was observed by STEM to determine the condition of the high dielectric material 3.

In the Examples and Comparative Examples shown in Tables 2-4 and 2-7, it was confirmed that the side wall 4 and the high dielectric material 3 were not etched. Therefore, in Tables 2-4 and 2-7, there are shown the evaluation results of the conditions of the dummy gate 1 made of silicon, the aluminum metal gate 2 and the interlayer insulating film 5.

In Examples 2-1 to 2-72 (Table 2-4) to which the production process of the present invention was applied, it was confirmed that the dummy gate 1 made of silicon was selectively etched while preventing the aluminum metal gate 2 and the interlayer insulating film 5 from being etched.

Comparative Example 2-1

Using the structural body having the transistor structure 1A, the same evaluation procedure as in Example 2-1 was carried out except for using a 0.01 wt % hydrofluoric acid aqueous solution (etching solution 2-5A as shown in Table 2-5) as described in Patent Document 2 in place of the etching solution (I), and using an aqueous solution containing 5% by weight of 1,3-propanediamine and 40% by weight of xylitol (etching solution 2-3G as shown in Table 2-3) in place of the etching solution (II). As a result, although no change in condition of the interlayer insulating film 5 occurred, the dummy gate 1 made of silicon was not etched, and large holes were formed in the aluminum metal gate 2. On the other hand, in Examples 2-1 to 2-13 as shown in Table 2-4 in which the etching solution 2-3G was also used, it was confirmed that the dummy gate 1 made of silicon was etched while preventing the aluminum metal gate 2 and the interlayer insulating film 5 from being etched. From these results, it was recognized that the non-removal of the dummy gate 1 made of silicon by etching and the formation of large holes in the aluminum metal gate 2 were caused by using the etching solution 2-5A in place of the etching solution (I). Therefore, it was confirmed that the process described in Patent Document 2 was inapplicable to removal of the natural silicon oxide film formed on a surface of silicon in the process for producing the transistor containing the high dielectric material and the aluminum-containing metal gate as aimed by the present invention.

Comparative Example 2-2

Using the structural body having the transistor structure 1I, the same evaluation procedure as in Example 2-1 was carried out except for using a 80 wt % 2-propanol aqueous solution (etching solution 2-5B as shown in Table 2-5) in place of the etching solution (I), and using an aqueous solution containing 5% by weight of 1,3-propanediamine and 40% by weight of xylitol (etching solution 2-3G as shown in Table 2-3) in place of the etching solution (II). As a result, although no change in conditions of the interlayer insulating film 5 and the aluminum metal gate 2 occurred, the silicon 1 was not etched. On the other hand, in Examples 2-1 to 2-13 as shown in Table 2-4 in which the etching solution 2-3G was also used, it was confirmed that the dummy gate 1 made of silicon was etched while preventing the aluminum metal gate 2 and the interlayer insulating film 5 from being etched. From these results, it was recognized that the non-removal of the dummy gate 1 made of silicon by etching despite no change in conditions of the interlayer insulating film 5 and the aluminum metal gate 2 was caused by using the etching solution 2-5B in place of the etching solution (I). Therefore, it was confirmed that the water-soluble organic solvent aqueous solution was inapplicable to removal of the natural silicon oxide film formed on a surface of silicon in the process for producing the transistor containing the high dielectric material and the aluminum-containing metal gate as aimed by the present invention.

Comparative Example 2-3

Using the structural body having the transistor structure 1F, the same evaluation procedure as in Example 2-1 was carried out except for using a 1 wt % sulfuric acid aqueous solution (etching solution 2-5C as shown in Table 2-5) in place of the etching solution (I), and using an aqueous solution containing 5% by weight of 1,3-propanediamine and 40% by weight of xylitol (etching solution 2-3G as shown in Table 2-3) in place of the etching solution (II). As a result, although no change in condition of the interlayer insulating film 5 occurred, the dummy gate 1 made of silicon was not etched, and large holes were formed in the aluminum metal gate 2. On the other hand, in Examples 2-1 to 2-13 as shown in Table 2-4 in which the etching solution 2-3G was also used, it was confirmed that the dummy gate 1 made of silicon was etched while preventing the aluminum metal gate 2 and the interlayer insulating film 5 from being etched. From these results, it was recognized that the non-removal of the dummy gate 1 made of silicon by etching and the formation of large holes in the aluminum metal gate 2 despite no change in condition of the interlayer insulating film 5 were caused by using the etching solution 2-5C in place of the etching solution (I). Therefore, it was confirmed that the acid aqueous solution was inapplicable to removal of the natural silicon oxide film formed on a surface of silicon in the process for producing the transistor containing the high dielectric material and the aluminum-containing metal gate as aimed by the present invention.

Comparative Example 2-4

Using the structural body having the transistor structure 1C, the same evaluation procedure as in Example 2-1 was carried out except for using an aqueous solution containing 1% by weight of ammonium fluoride and 0.5% by weight of acetic acid (etching solution 2-5D as shown in Table 2-5) in place of the etching solution (I), and using an aqueous solution containing 5% by weight of 1,3-propanediamine and 40% by weight of xylitol (etching solution 2-3G as shown in Table 2-3) in place of the etching solution (II). As a result, although the dummy gate 1 made of silicon was etched, large depression was caused on the interlayer insulating film 5, and large holes were formed in the aluminum metal gate 2. On the other hand, in Examples 2-1 to 2-13 as shown in Table 2-4 in which the etching solution 2-3G was also used, it was confirmed that the dummy gate 1 made of silicon was etched while preventing the aluminum metal gate 2 and the interlayer insulating film 5 from being etched. From these results, it was recognized that the formation of large depression on the interlayer insulating film 5 and the formation of large holes in the aluminum metal gate 2 despite the removal of the dummy gate 1 made of silicon by etching were caused by using the etching solution 2-5D in place of the etching solution (I). Therefore, it was confirmed that the aqueous solution containing the fluorine compound and the acid was inapplicable to removal of the natural silicon oxide film formed on a surface of silicon in the process for producing the transistor containing the high dielectric material and the aluminum-containing metal gate as aimed by the present invention.

Comparative Example 2-5

Using the structural body having the transistor structure 1G, the same evaluation procedure as in Example 2-1 was carried out except for using an aqueous solution containing 60% by weight of N-methyl-2-pyrrolidone and 0.5% by weight of methanesulfonic acid (etching solution 2-5E as shown in Table 2-5) in place of the etching solution (I), and using an aqueous solution containing 5% by weight of 1,3-propanediamine and 40% by weight of xylitol (etching solution 2-3G as shown in Table 2-3) in place of the etching solution (II). As a result, although no change in condition of the interlayer insulating film 5 occurred, the dummy gate 1 made of silicon was not etched, and large holes were formed in the aluminum metal gate 2. On the other hand, in Examples 2-1 to 2-13 as shown in Table 2-4 in which the etching solution 2-3G was also used, it was confirmed that the dummy gate 1 made of silicon was etched while preventing the aluminum metal gate 2 and the interlayer insulating film 5 from being etched. From these results, it was recognized that the non-removal of the dummy gate 1 made of silicon by etching and the formation of large holes in the aluminum metal gate 2 despite no change in condition of the interlayer insulating film 5 were caused by using the etching solution 2-5E in place of the etching solution (I). Therefore, it was confirmed that the aqueous solution containing the water-soluble organic solvent and the acid was inapplicable to removal of the natural silicon oxide film formed on a surface of silicon in the process for producing the transistor containing the high dielectric material and the aluminum-containing metal gate as aimed by the present invention.

Comparative Example 2-6

Using the structural body having the transistor structure 1D, the same evaluation procedure as in Example 2-1 was carried out except for using an aqueous solution containing 1% by weight of ammonium fluoride, 60% by weight of N,N-dimethylacetamide and 10% by weight of diethylene glycol monobutyl ether (etching solution 2-2E as shown in Table 2-2) in place of the etching solution (I), and using the 2 wt % tetramethyl ammonium hydroxide aqueous solution (etching solution 2-6A as shown in Table 2-6) as described in Non-Patent Document 2 in place of the etching solution (II). As a result, although no change in condition of the interlayer insulating film 5 occurred, the dummy gate 1 made of silicon was not etched, and large holes were formed in the aluminum metal gate 2. On the other hand, in Examples 2-14 to 2-22 as shown in Table 2-4 in which the etching solution 2-2E was also used, it was confirmed that the dummy gate 1 made of silicon was etched while preventing the aluminum metal gate 2 and the interlayer insulating film 5 from being etched. From these results, it was recognized that the non-removal of the dummy gate 1 made of silicon by etching and the formation of large holes in the aluminum metal gate 2 despite no change in condition of the interlayer insulating film 5 were caused by using the etching solution 2-6A in place of the etching solution (II). Therefore, it was confirmed that the etching solution as described in Non-Patent Document 2 was inapplicable to etching of silicon in the process for producing the transistor containing the high dielectric material and the aluminum-containing metal gate as aimed by the present invention.

Comparative Example 2-7

Using the structural body having the transistor structure 1B, the same evaluation procedure as in Example 2-1 was carried out except for using an aqueous solution containing 1% by weight of ammonium fluoride, 60% by weight of N,N-dimethylacetamide and 10% by weight of diethylene glycol monobutyl ether (etching solution 2-2E as shown in Table 2-2) in place of the etching solution (I), and using the aqueous solution containing 0.5% by weight of tetramethyl ammonium hydroxide and 1% by weight of silicon (etching solution 2-6B as shown in Table 2-6) as described in Patent Document 6 in place of the etching solution (II). As a result, although no change in conditions of the interlayer insulating film 5 and the aluminum metal gate 2 occurred, the dummy gate 1 made of silicon was not etched. On the other hand, in Examples 2-14 to 2-22 as shown in Table 2-4 in which the etching solution 2-2E was also used, it was confirmed that the dummy gate 1 made of silicon was etched while preventing the aluminum metal gate 2 and the interlayer insulating film 5 from being etched. From these results, it was recognized that the non-removal of the dummy gate 1 made of silicon by etching despite no change in conditions of the interlayer insulating film 5 and the aluminum metal gate 2 was caused by using the etching solution 2-6B in place of the etching solution (II). Therefore, it was confirmed that the etching solution as described in Patent Document 6 was inapplicable to etching of silicon in the process for producing the transistor containing the high dielectric material and the aluminum-containing metal gate as aimed by the present invention.

Comparative Example 2-8

Using the structural body having the transistor structure 1C, the same evaluation procedure as in Example 2-1 was carried out except for using an aqueous solution containing 1% by weight of ammonium fluoride, 60% by weight of N,N-dimethylacetamide and 10% by weight of diethylene glycol monobutyl ether (etching solution 2-2E as shown in Table 2-2) in place of the etching solution (I), and using the aqueous solution containing 10% by weight of tetramethyl ammonium hydroxide, 10% by weight of hydroxylamine and 5% by weight of sorbitol (etching solution 2-6C as shown in Table 2-6) as described in Patent Document 7 in place of the etching solution (II). As a result, although the dummy gate 1 made of silicon was etched and no change in condition of the interlayer insulating film 5 occurred, large depression was formed on the aluminum metal gate 2. On the other hand, in Examples 2-14 to 2-22 as shown in Table 2-4 in which the etching solution 2-2E was also used, it was confirmed that the dummy gate 1 made of silicon was etched while preventing the aluminum metal gate 2 and the interlayer insulating film 5 from being etched. From these results, it was recognized that the formation of the large depression on the aluminum metal gate 2 despite the removal of the dummy gate 1 made of silicon by etching and no change in condition of the interlayer insulating film 5 was caused by using the etching solution 2-6C in place of the etching solution (II). Therefore, it was confirmed that the etching solution as described in Patent Document 7 was inapplicable to etching of silicon in the process for producing the transistor containing the high dielectric material and the aluminum-containing metal gate as aimed by the present invention.

Comparative Example 2-9

Using the structural body having the transistor structure 1G, the same evaluation procedure as in Example 2-1 was carried out except for using an aqueous solution containing 1% by weight of ammonium fluoride, 60% by weight of N,N-dimethylacetamide and 10% by weight of diethylene glycol monobutyl ether (etching solution 2-2E as shown in Table 2-2) in place of the etching solution (I), and using the aqueous solution containing 2.4% by weight of tetramethyl ammonium hydroxide and 5% by weight of sorbitol (etching solution 2-6D as shown in Table 2-6) as described in Patent Document 8 in place of the etching solution (H). As a result, although no change in condition of the interlayer insulating film 5 occurred, the dummy gate 1 made of silicon was not etched, and large holes were formed in the aluminum metal gate 2. On the other hand, in Examples 2-14 to 2-22 as shown in Table 2-4 in which the etching solution 2-2E was also used, it was confirmed that the dummy gate 1 made of silicon was etched while preventing the aluminum metal gate 2 and the interlayer insulating film 5 from being etched. From these results, it was recognized that the non-removal of the dummy gate 1 made of silicon by etching and the formation of the large holes in the aluminum metal gate 2 despite no change in condition of the interlayer insulating film 5 were caused by using the etching solution 2-6D in place of the etching solution (II). Therefore, it was confirmed that the etching solution as described in Patent Document 8 was inapplicable to etching of silicon in the process for producing the transistor containing the high dielectric material and the aluminum-containing metal gate as aimed by the present invention.

Comparative Example 2-10

Using the structural body having the transistor structure 1E, the same evaluation procedure as in Example 2-1 was carried out except for using an aqueous solution containing 1% by weight of ammonium fluoride, 60% by weight of N,N-dimethylacetamide and 10% by weight of diethylene glycol monobutyl ether (etching solution 2-2E as shown in Table 2-2) in place of the etching solution (I), and using the aqueous solution containing 5% by weight of hexamethylenediamine (1,6-hexanediamine) and 30% by weight of sorbitol (etching solution 2-6E as shown in Table 2-6) as described in Patent Document 9 in place of the etching solution (II). As a result, although no change in conditions of the interlayer insulating film 5 and the aluminum metal gate 2 occurred, the dummy gate 1 made of silicon was not etched. On the other hand, in Examples 2-14 to 2-22 as shown in Table 2-4 in which the etching solution 2-2E was also used, it was confirmed that the dummy gate 1 made of silicon was etched while preventing the aluminum metal gate 2 and the interlayer insulating film 5 from being etched. From these results, it was recognized that the non-removal of the dummy gate 1 made of silicon by etching despite no change in conditions of the interlayer insulating film 5 and the aluminum metal gate 2 was caused by using the etching solution 2-6E in place of the etching solution (II). Therefore, it was confirmed that the etching solution as described in Patent Document 9 was inapplicable to etching of silicon in the process for producing the transistor containing the high dielectric material and the aluminum-containing metal gate as aimed by the present invention.

Comparative Example 2-11

Using the structural body having the transistor structure 1I, the same evaluation procedure as in Example 2-1 was carried out except for using an aqueous solution containing 1% by weight of ammonium fluoride, 60% by weight of N,N-dimethylacetamide and 10% by weight of diethylene glycol monobutyl ether (etching solution 2-2E as shown in Table 2-2) in place of the etching solution (I), and using the aqueous solution containing 4% by weight of tetramethyl ammonium hydroxide, 0.01% by weight of trimethylamine, 80% by weight of propylene glycol and 4% by weight of glycerin (etching solution 2-6F as shown in Table 2-6) as described in Patent Document 10 in place of the etching solution (II). As a result, although no change in conditions of the interlayer insulating film 5 and the aluminum metal gate 2 occurred, the dummy gate 1 made of silicon was not etched. On the other hand, in Examples 2-14 to 2-22 as shown in Table 2-4 in which the etching solution 2-2E was also used, it was confirmed that the dummy gate 1 made of silicon was etched while preventing the aluminum metal gate 2 and the interlayer insulating film 5 from being etched. From these results, it was recognized that the non-removal of the dummy gate 1 made of silicon by etching despite no change in conditions of the interlayer insulating film 5 and the aluminum metal gate 2 was caused by using the etching solution 2-6F in place of the etching solution (II). Therefore, it was confirmed that the etching solution as described in Patent Document 10 was inapplicable to etching of silicon in the process for producing the transistor containing the high dielectric material and the aluminum-containing metal gate as aimed by the present invention.

Comparative Example 2-12

Using the structural body having the transistor structure 1F, the same evaluation procedure as in Example 2-1 was carried out except for using an aqueous solution containing 1% by weight of ammonium fluoride, 60% by weight of N,N-dimethylacetamide and 10% by weight of diethylene glycol monobutyl ether (etching solution 2-2E as shown in Table 2-2) in place of the etching solution (I), and using a 0.5 wt % 1,3-propanediamine aqueous solution (etching solution 2-6G as shown in Table 2-6) in place of the etching solution (II). As a result, although no change in condition of the interlayer insulating film 5 occurred, the dummy gate 1 made of silicon was not etched, and large holes were formed in the aluminum metal gate 2. On the other hand, in Examples 2-14 to 2-22 as shown in Table 2-4 in which the etching solution 2-2E was also used, it was confirmed that the dummy gate 1 made of silicon was etched while preventing the aluminum metal gate 2 and the interlayer insulating film 5 from being etched. From these results, it was recognized that the non-removal of the dummy gate 1 made of silicon by etching and the formation of large holes in the aluminum metal gate 2 despite no change in condition of the interlayer insulating film 5 were caused by using the etching solution 2-6G in place of the etching solution (II). Therefore, it was confirmed that the alkali compound aqueous solution was inapplicable to etching of silicon in the process for producing the transistor containing the high dielectric material and the aluminum-containing metal gate as aimed by the present invention.

Comparative Example 2-13

Using the structural body having the transistor structure 1H, the same evaluation procedure as in Example 2-1 was carried out except for using an aqueous solution containing 1% by weight of ammonium fluoride, 60% by weight of N,N-dimethylacetamide and 10% by weight of diethylene glycol monobutyl ether (etching solution 2-2E as shown in Table 2-2) in place of the etching solution (I), and using a 10 wt % sorbitol aqueous solution (etching solution 2-6H as shown in Table 2-6) in place of the etching solution (II). As a result, although no change in conditions of the interlayer insulating film 5 and the aluminum metal gate 2 occurred, the dummy gate 1 made of silicon was not etched. On the other hand, in Examples 2-14 to 2-22 as shown in Table 2-4 in which the etching solution 2-2E was also used, it was confirmed that the dummy gate 1 made of silicon was etched while preventing the aluminum metal gate 2 and the interlayer insulating film 5 from being etched. From these results, it was recognized that the non-removal of the dummy gate 1 made of silicon by etching despite no change in conditions of the interlayer insulating film 5 and the aluminum metal gate 2 was caused by using the etching solution 2-6H in place of the etching solution (II). Therefore, it was confirmed that the polyhydric alcohol aqueous solution was inapplicable to etching of silicon in the process for producing the transistor containing the high dielectric material and the aluminum-containing metal gate as aimed by the present invention.

Comparative Example 2-14

Using the structural body having the transistor structure 1A, the same evaluation procedure as in Example 2-1 was carried out except for using an aqueous solution containing 1% by weight of ammonium fluoride, 60% by weight of N,N-dimethylacetamide and 10% by weight of diethylene glycol monobutyl ether (etching solution 2-2E as shown in Table 2-2) in place of the etching solution (I), and using an aqueous solution containing 6% by weight of 1,3-propanediamine and 10% by weight of inositol (etching solution 2-6I as shown in Table 2-6) in place of the etching solution (II). As a result, although the dummy gate 1 made of silicon was etched and no change in condition of the interlayer insulating film 5 occurred, large depression was formed on the aluminum metal gate 2. On the other hand, in Examples 2-14 to 2-22 as shown in Table 2-4 in which the etching solution 2-2E was also used, it was confirmed that the dummy gate 1 made of silicon was etched while preventing the aluminum metal gate 2 and the interlayer insulating film 5 from being etched. From these results, it was recognized that the formation of the large depression on the aluminum metal gate 2 despite the removal of the dummy gate 1 made of silicon by etching and no change in condition of the interlayer insulating film 5 was caused by using the etching solution 2-6I in place of the etching solution (II). Therefore, it was confirmed that the aqueous solution containing the alkali compound and the cyclic polyhydric alcohol was inapplicable to etching of silicon in the process for producing the transistor containing the high dielectric material and the aluminum-containing metal gate as aimed by the present invention.

Comparative Example 2-15

Using the structural body having the transistor structure 1A, the same evaluation procedure as in Example 2-1 was carried out except for using an aqueous solution containing 1% by weight of ammonium fluoride, 60% by weight of N,N-dimethylacetamide and 10% by weight of diethylene glycol monobutyl ether (etching solution 2-2E as shown in Table 2-2) in place of the etching solution (I), and using an aqueous solution containing 5% by weight of 1,3-propanediamine and 10% by weight of sucrose (etching solution 2-6J as shown in Table 2-6) in place of the etching solution (II). As a result, although the dummy gate 1 made of silicon was etched and no change in condition of the interlayer insulating film 5 occurred, large depression was formed on the aluminum metal gate 2. On the other hand, in Examples 2-14 to 2-22 as shown in Table 2-4 in which the etching solution 2-2E was also used, it was confirmed that the dummy gate 1 made of silicon was etched while preventing the aluminum metal gate 2 and the interlayer insulating film 5 from being etched. From these results, it was recognized that the formation of the large depression on the aluminum metal gate 2 despite the removal of the dummy gate 1 made of silicon by etching and no change in condition of the interlayer insulating film 5 was caused by using the etching solution 2-6J in place of the etching solution (II). Therefore, it was confirmed that the aqueous solution containing the alkali compound and the non-reducing sugar was inapplicable to etching of silicon in the process for producing the transistor containing the high dielectric material and the aluminum-containing metal gate as aimed by the present invention.

TABLE 2-1

| Transistor structure | Materials | | |
| --- | --- | --- | --- |
| | High dielectric material 3 | Side wall 4 | Interlayer insulating film 5 |
| 1A | HfO$_2$ | SiN | HDP |
| 1B | HfSiO | SiN | HDP |
| 1C | HfSiON | SiN | HDP |
| 1D | HfLaO | SiN | TEOS |
| 1E | HfLaON | SiN | TEOS |
| 1F | HfTiSiON | SiN | TEOS |
| 1G | HfAlSiON | SiN | TEOS |
| 1H | HfZrO | SiN | TEOS |
| 1I | Al$_2$O$_3$ | SiN | BPSG |

Note:
HDP: Silicon oxide film produced by high-density plasma chemical method
TEOS: Tetraethoxysilane
BPSG: Boron phosphor silicate glass

TABLE 2-2

| Etching solution (I) | Fluorine compound Kind | Conc. (wt %) | Water-soluble organic solvent 1 Kind | Conc. (wt %) | Water-soluble organic solvent 2 Kind | Conc. (wt %) | Acid Kind | Conc. (wt %) | Water Conc. (wt %) |
|---|---|---|---|---|---|---|---|---|---|
| 2-2A | HFA[*1)] | 0.05 | Ethanol | 80 | Not added | | Not added | | 19.95 |
| 2-2B | NH4F[*2)] | 8 | 2-Propanol | 20 | Not added | | Not added | | 72 |
| 2-2C | NH4F[*2)] | 5 | DEG[*4)] | 30 | DPME[*9)] | 20 | Not added | | 45 |
| 2-2D | NH4F[*2)] | 0.01 | DGME[*5)] | 90 | Not added | | Acetic acid | 5 | 4.99 |
| 2-2E | NH4F[*2)] | 1 | DMA[*6)] | 60 | DGBE[*10)] | 10 | Not added | | 29 |
| 2-2F | Acid NH4F[*3)] | 0.1 | DMF[*7)] | 50 | DPPE[*11)] | 20 | Not added | | 29.9 |
| 2-2G | NH4F[*2)] | 0.5 | DMA[*6)] | 50 | EG[*12)] | 10 | Phosphoric acid | 3 | 36.5 |
| 2-2H | NH4F[*2)] | 0.5 | DMA[*6)] | 60 | Not added | | Hydrochloric acid | 0.05 | 39.5 |
| 2-2I | NH4F[*2)] | 1 | DMSO[*8)] | 70 | Not added | | Sulfuric acid | 1 | 28 |
| 2-2J | NH4F[*2)] | 1 | DMF[*7)] | 70 | Not added | | Methanesulfonic acid | 0.05 | 28.95 |
| 2-2K | NH4F[*2)] | 0.5 | DMA[*6)] | 60 | Not added | | Nitric acid | 0.05 | 39.45 |
| 2-2L | NH4F[*2)] | 0.5 | N-methyl-2-pyrrolidone | 60 | Not added | | Propionic acid | 0.05 | 39.45 |
| 2-2M | NH4F[*2)] | 0.5 | DMF[*7)] | 60 | Not added | | Oxalic acid | 0.05 | 39.45 |

Note
HFA[*1)]: Hydrofluoric acid; NH4F[*2)]: Ammonium fluoride; Acid NH4F[*3)]: Acid ammonium fluoride; DEG[*4)]: Diethylene glycol; DGME[*5)]: Diethylene glycol monomethyl ether; DMA[*6)]: N,N-dimethylacetamide; DMF[*7)]: N,N-dimethylformamide; DMSO[*8)]: Dimethyl sulfoxide; DPME[*9)]: Dipropylene glycol monomethyl ether; DGBE[*10)]: Diethylene glycol monobutyl ether; DPPE[*11)]: Dipropylene glycol monopropyl ether; EG[*12)]: Ethylene glycol

TABLE 2-3

| Etching solution (II) | Alkali Kind | Conc. (wt %) | Polyhydric alcohol Kind | Conc. (wt %) | Water Conc. (wt %) |
|---|---|---|---|---|---|
| 2-3A | Ammonia | 1 | Sorbitol | 10 | 89 |
| 2-3B | Ethylenediamine | 1 | Sorbitol | 10 | 89 |
| 2-3C | 1,2-Propanediamine | 1 | Glycerin | 30 | 69 |
| 2-3D | 1,3-Propanediamine | 1 | Meso-erythritol | 30 | 69 |
| 2-3E | 1,3-Propanediamine | 0.6 | Xylitol | 30 | 69.5 |
| 2-3F | 1,3-Propanediamine | 30 | Sorbitol | 10 | 60 |
| 2-3G | 1,3-Propanediamine | 5 | Xylitol | 40 | 55 |
| 2-3H | 1,3-Propanediamine | 5 | Sorbitol | 30 | 65 |
| 2-3I | Diethylenetriamine | 1 | Sorbitol | 10 | 89 |
| 2-3J | Triethylenetetramine | 1 | Sorbitol | 10 | 89 |

TABLE 2-4

| Examples | Transistor structure | Etching of natural silicon oxide film Etching solution | Temp. (° C.) | Immersion time (min) | Etching of polysilicon Etching solution (II) | Temp. (° C.) | Immersion time (min) | Evaluation Etching condition of dummy gate | Damage to Al | Damage to interlayer insulating film |
|---|---|---|---|---|---|---|---|---|---|---|
| 2-1 | 1A | 2-2A | 25 | 5 | 2-3G | 25 | 2 | ○ | ◎ | ◎ |
| 2-2 | 1A | 2-2B | 25 | 2 | 2-3G | 25 | 2 | ○ | ○ | ◎ |
| 2-3 | 1A | 2-2C | 25 | 2 | 2-3G | 25 | 2 | ○ | ◎ | ◎ |
| 2-4 | 1A | 2-2D | 25 | 5 | 2-3G | 25 | 5 | ○ | ◎ | ○ |
| 2-5 | 1A | 2-2E | 25 | 2 | 2-3G | 25 | 2 | ○ | ◎ | ◎ |
| 2-6 | 1A | 2-2F | 25 | 2 | 2-3G | 25 | 2 | ○ | ◎ | ◎ |
| 2-7 | 1A | 2-2G | 25 | 2 | 2-3G | 25 | 2 | ○ | ◎ | ◎ |
| 2-8 | 1A | 2-2H | 25 | 2 | 2-3G | 25 | 2 | ○ | ◎ | ◎ |
| 2-9 | 1A | 2-2I | 25 | 2 | 2-3G | 25 | 2 | ○ | ◎ | ◎ |
| 2-10 | 1A | 2-2J | 25 | 2 | 2-3G | 25 | 2 | ○ | ◎ | ◎ |
| 2-11 | 1A | 2-2K | 25 | 2 | 2-3G | 25 | 2 | ○ | ◎ | ◎ |
| 2-12 | 1A | 2-2L | 25 | 2 | 2-3G | 25 | 2 | ○ | ◎ | ◎ |
| 2-13 | 1A | 2-2M | 25 | 2 | 2-3G | 25 | 2 | ○ | ◎ | ◎ |
| 2-14 | 1A | 2-2E | 25 | 2 | 2-3A | 25 | 4 | ○ | ◎ | ◎ |
| 2-15 | 1A | 2-2E | 25 | 2 | 2-3B | 25 | 2 | ○ | ◎ | ◎ |
| 2-16 | 1A | 2-2E | 25 | 2 | 2-3C | 25 | 3 | ○ | ◎ | ◎ |
| 2-17 | 1A | 2-2E | 25 | 2 | 2-3D | 25 | 2 | ○ | ◎ | ◎ |
| 2-18 | 1A | 2-2E | 25 | 2 | 2-3E | 25 | 2 | ○ | ◎ | ◎ |
| 2-19 | 1A | 2-2E | 25 | 2 | 2-3F | 25 | 2 | ○ | ◎ | ◎ |
| 2-20 | 1A | 2-2E | 25 | 2 | 2-3H | 25 | 2 | ○ | ◎ | ◎ |
| 2-21 | 1A | 2-2E | 25 | 2 | 2-3I | 25 | 3 | ○ | ◎ | ◎ |
| 2-22 | 1A | 2-2E | 25 | 2 | 2-3J | 25 | 2 | ○ | ◎ | ◎ |
| 2-23 | 1B | 2-2A | 25 | 5 | 2-3G | 25 | 2 | ○ | ◎ | ◎ |

TABLE 2-4-continued

| Examples | Transistor structure | Etching of natural silicon oxide film | | | Etching of polysilicon | | | Evaluation | | |
|---|---|---|---|---|---|---|---|---|---|---|
| | | Etching solution | Temp. (° C.) | Immersion time (min) | Etching solution (II) | Temp. (° C.) | Immersion time (min) | Etching condition of dummy gate | Damage to Al | Damage to interlayer insulating film |
| 2-24 | 1B | 2-2B | 25 | 2 | 2-3G | 25 | 2 | ○ | ○ | ◎ |
| 2-25 | 1B | 2-2C | 25 | 2 | 2-3G | 25 | 2 | ○ | ◎ | ◎ |
| 2-26 | 1B | 2-2D | 25 | 5 | 2-3G | 25 | 5 | ○ | ◎ | ○ |
| 2-27 | 1B | 2-2E | 25 | 2 | 2-3G | 25 | 2 | ○ | ◎ | ◎ |
| 2-28 | 1B | 2-2F | 25 | 2 | 2-3G | 25 | 2 | ○ | ◎ | ◎ |
| 2-29 | 1B | 2-2G | 25 | 2 | 2-3G | 25 | 2 | ○ | ◎ | ◎ |
| 2-30 | 1B | 2-2H | 25 | 2 | 2-3G | 25 | 2 | ○ | ◎ | ◎ |
| 2-31 | 1B | 2-2I | 25 | 2 | 2-3G | 25 | 2 | ○ | ◎ | ◎ |
| 2-32 | 1B | 2-2J | 25 | 2 | 2-3G | 25 | 2 | ○ | ◎ | ◎ |
| 2-33 | 1B | 2-2K | 25 | 2 | 2-3G | 25 | 2 | ○ | ◎ | ◎ |
| 2-34 | 1B | 2-2L | 25 | 2 | 2-3G | 25 | 2 | ○ | ◎ | ◎ |
| 2-35 | 1B | 2-2M | 25 | 2 | 2-3G | 25 | 2 | ○ | ◎ | ◎ |
| 2-36 | 1B | 2-2E | 25 | 2 | 2-3A | 25 | 4 | ○ | ◎ | ◎ |
| 2-37 | 1B | 2-2E | 25 | 2 | 2-3B | 25 | 2 | ○ | ◎ | ◎ |
| 2-38 | 1B | 2-2E | 25 | 2 | 2-3C | 25 | 3 | ○ | ◎ | ◎ |
| 2-39 | 1B | 2-2E | 25 | 2 | 2-3D | 25 | 2 | ○ | ◎ | ◎ |
| 2-40 | 1B | 2-2E | 25 | 2 | 2-3E | 25 | 2 | ○ | ◎ | ◎ |
| 2-41 | 1B | 2-2E | 25 | 2 | 2-3F | 25 | 2 | ○ | ◎ | ◎ |
| 2-42 | 1B | 2-2E | 25 | 2 | 2-3H | 25 | 2 | ○ | ◎ | ◎ |
| 2-43 | 1B | 2-2E | 25 | 2 | 2-3I | 25 | 3 | ○ | ◎ | ◎ |
| 2-44 | 1B | 2-2E | 25 | 2 | 2-3J | 25 | 2 | ○ | ◎ | ◎ |
| 2-45 | 1C | 2-2A | 25 | 5 | 2-3G | 25 | 2 | ○ | ◎ | ◎ |
| 2-46 | 1C | 2-2B | 25 | 2 | 2-3G | 25 | 2 | ○ | ○ | ◎ |
| 2-47 | 1C | 2-2C | 25 | 2 | 2-3G | 25 | 2 | ○ | ◎ | ◎ |
| 2-48 | 1C | 2-2D | 25 | 5 | 2-3G | 25 | 5 | ○ | ◎ | ○ |
| 2-49 | 1C | 2-2E | 25 | 2 | 2-3G | 25 | 2 | ○ | ◎ | ◎ |
| 2-50 | 1C | 2-2F | 25 | 2 | 2-3G | 25 | 2 | ○ | ◎ | ◎ |
| 2-51 | 1C | 2-2G | 25 | 2 | 2-3G | 25 | 2 | ○ | ◎ | ◎ |
| 2-52 | 1C | 2-2H | 25 | 2 | 2-3G | 25 | 2 | ○ | ◎ | ◎ |
| 2-53 | 1C | 2-2I | 25 | 2 | 2-3G | 25 | 2 | ○ | ◎ | ◎ |
| 2-54 | 1C | 2-2J | 25 | 2 | 2-3G | 25 | 2 | ○ | ◎ | ◎ |
| 2-55 | 1C | 2-2K | 25 | 2 | 2-3G | 25 | 2 | ○ | ◎ | ◎ |
| 2-56 | 1C | 2-2L | 25 | 2 | 2-3G | 25 | 2 | ○ | ◎ | ◎ |
| 2-57 | 1C | 2-2M | 25 | 2 | 2-3G | 26 | 2 | ○ | ◎ | ◎ |
| 2-58 | 1C | 2-2E | 25 | 2 | 2-3A | 25 | 4 | ○ | ◎ | ◎ |
| 2-59 | 1C | 2-2E | 25 | 2 | 2-3B | 25 | 2 | ○ | ◎ | ◎ |
| 2-60 | 1C | 2-2E | 25 | 2 | 2-3C | 25 | 3 | ○ | ◎ | ◎ |
| 2-61 | 1C | 2-2E | 25 | 2 | 2-3D | 25 | 2 | ○ | ◎ | ◎ |
| 2-62 | 1C | 2-2E | 25 | 2 | 2-3E | 25 | 2 | ○ | ◎ | ◎ |
| 2-63 | 1C | 2-2E | 25 | 2 | 2-3F | 25 | 2 | ○ | ◎ | ◎ |
| 2-64 | 1C | 2-2E | 25 | 2 | 2-3H | 25 | 2 | ○ | ◎ | ◎ |
| 2-65 | 1C | 2-2E | 25 | 2 | 2-3I | 25 | 3 | ○ | ◎ | ◎ |
| 2-66 | 1C | 2-2E | 25 | 2 | 2-3J | 25 | 2 | ○ | ◎ | ◎ |
| 2-67 | 1D | 2-2E | 25 | 2 | 2-3G | 25 | 2 | ○ | ◎ | ◎ |
| 2-68 | 1E | 2-2E | 25 | 2 | 2-3G | 25 | 2 | ○ | ◎ | ◎ |
| 2-69 | 1F | 2-2E | 25 | 2 | 2-3G | 25 | 2 | ○ | ◎ | ◎ |
| 2-70 | 1G | 2-2E | 25 | 2 | 2-3G | 25 | 2 | ○ | ◎ | ◎ |
| 2-71 | 1H | 2-2E | 25 | 2 | 2-3G | 25 | 2 | ○ | ◎ | ◎ |
| 2-72 | 1I | 2-2E | 25 | 2 | 2-3G | 25 | 2 | ○ | ◎ | ◎ |

TABLE 2-5

| Etching solution | Fluorine compound | | Water-soluble organic solvent | | Acid | | Water |
|---|---|---|---|---|---|---|---|
| | Kind | Conc. (wt %) | Kind | Conc. (wt %) | Kind | Conc. (wt %) | Conc. (wt %) |
| 2-5A | Hydrofluoric acid | 0.01 | Not added | | Not added | | 99.99 |
| 2-5B | Not added | | 2-Propanol | 80 | Not added | | 20 |
| 2-5C | Not added | | Not added | | Sulfuric acid | 1 | 99 |
| 2-5D | Ammonium fluoride | 1 | Not added | | Acetic acid | 0.5 | 98.5 |
| 2-5E | Not added | | N-methyl-2-pyrrolidone | 60 | Methanesulfonic acid | 0.5 | 39.5 |

TABLE 2-6

| Etching solution | Composition of etching solution (conc.: wt %) |
|---|---|
| 2-6A | Tetramethyl ammonium hydroxide: 2%; water: 98% |
| 2-6B | Tetramethyl ammonium hydroxide: 0.5%; silicon: 0.1%; water: 99.4% |
| 2-6C | Tetramethyl ammonium hydroxide: 10%; hydroxyl amine: 10%; sorbitol: 5%; water: 75% |
| 2-6D | Tetramethyl ammonium hydroxide: 2.4%; sorbitol: 5%; water: 92.6% |
| 2-6E | Hexamethylenediamine (1,6-hexadiamine): 5%; sorbitol: 30%; water: 65% |
| 2-6F | Tetramethyl ammonium hydroxide: 4%; trimethylamine: 0.01%; propylene glycol: 80%; glycerin: 4%; water: 11.99% |
| 2-6G | 1,3-Propanediamine: 0.5%; water: 99.5% |
| 2-6H | Sorbitol: 10%; water: 90% |
| 2-6I | 1,3-Propanediamine: 5%; inositol: 10%; water: 85% |
| 2-6J | 1,3-Propanediamine: 5%; sucrose: 10%; water: 85% |

TABLE 2-7

| | | Etching of natural silicon oxide film | | | Etching of polysilicon | | | Evaluation | | |
|---|---|---|---|---|---|---|---|---|---|---|
| Comparative Examples | Transistor structure | Etching solution | Temp. (° C.) | Immersion time (min) | Etching solution | Temp. (° C.) | Immersion time (min) | Etching condition of dummy gate | Damage to Al | Damage to interlayer insulating film |
| 2-1 | 1A | 2-5A | 25 | 2 | 2-3G | 25 | 2 | X | X | ◎ |
| 2-2 | 1I | 2-5B | 25 | 2 | 2-3G | 25 | 2 | X | ◎ | ◎ |
| 2-3 | 1F | 2-5C | 25 | 2 | 2-3G | 25 | 2 | X | X | ◎ |
| 2-4 | 1C | 2-5D | 25 | 2 | 2-3G | 25 | 2 | ○ | X | X |
| 2-5 | 1G | 2-5E | 25 | 2 | 2-3G | 25 | 2 | X | X | ◎ |
| 2-6 | 1D | 2-2E | 25 | 2 | 2-6A | 25 | 2 | X | X | ◎ |
| 2-7 | 1B | 2-2E | 25 | 2 | 2-6B | 25 | 2 | X | ◎ | ◎ |
| 2-8 | 1C | 2-2E | 25 | 2 | 2-6C | 25 | 2 | ○ | X | ◎ |
| 2-9 | 1G | 2-2E | 25 | 2 | 2-6D | 25 | 2 | X | X | ◎ |
| 2-10 | 1E | 2-2E | 25 | 2 | 2-6E | 25 | 2 | X | ◎ | ◎ |
| 2-11 | 1I | 2-2E | 25 | 2 | 2-6F | 25 | 2 | X | ◎ | ◎ |
| 2-12 | 1F | 2-2E | 25 | 2 | 2-6G | 25 | 2 | X | X | ◎ |
| 2-13 | 1H | 2-2E | 25 | 2 | 2-6H | 25 | 2 | X | ◎ | ◎ |
| 2-14 | 1A | 2-2E | 25 | 2 | 2-6I | 25 | 2 | ○ | X | ◎ |
| 2-15 | 1A | 2-2E | 25 | 2 | 2-6J | 25 | 2 | ○ | X | ◎ |

INDUSTRIAL APPLICABILITY

In the process for producing a transistor according to the present invention which is a process for producing a transistor including a laminate formed of at least a high dielectric material film and an aluminum metal gate by the method of removing a dummy gate made of silicon to replace the dummy gate with the aluminum metal gate, it is possible to selectively etch a natural silicon oxide film formed on a surface of silicon by contact of the silicon with air without etching aluminum, an interlayer insulating film and a side wall, and further to selectively etch the silicon without etching aluminum, an interlayer insulating film and a side wall as well as the high dielectric material film, so that the transistor having a high precision and a high quality can be produced with a high yield.

The invention claimed is:

1. A process for producing a transistor with a structural body comprising a substrate, and a dummy gate laminate formed by laminating a high dielectric material film and a dummy gate comprising silicon comprising a natural silicon oxide film on a surface thereof, a side wall disposed to cover a side surface of the laminate and an interlayer insulating film disposed to cover the side wall which are provided on the substrate, the process comprising:

(I): etching the natural silicon oxide film with an etching solution comprising 0.01 to 8% by weight of a fluorine compound, 20 to 90% by weight of a water-soluble organic solvent, and water, thereby replacing the dummy gate with an aluminum metal gate.

2. The process of claim 1, further comprising, subsequent to (I):

(II): etching the silicon with a second etching solution comprising (i) 0.1 to 40% by weight of at least one alkali compound selected from the group consisting of ammonia, and a diamine and a polyamine of formula (1):

$$H_2N—(CH_2CH_2NH)_mH \quad (1),$$

wherein m is an integer of 2 to 5; and, (ii) 5 to 50% by weight of a polyhydric alcohol of formula (2):

$$H—(CH(OH))_n—H \quad (2),$$

wherein n is an integer of 3 to 6, and (iii) 40 to 94.9% by weight of water.

3. The process of claim 2, wherein the diamine and the polyamine of formula (1) which are contained in the second etching solution are at least one selected from the group consisting of ethylenediamine, 1,2-propanediamine, and 1,3-propanediamine, and at least one selected from the group consisting of diethylenetriamine and triethylenetetramine, respectively.

4. The process of claim 2, wherein the polyhydric alcohol of formula (2) which is contained in the second etching solution is at least one compound selected from the group consisting of glycerin, meso-erythritol, xylitol, and sorbitol.

5. The process of claim 2, wherein the second etching solution contains 0.2 to 40% by weight of the alkali compound and 6 to 40% by weight of the polyhydric alcohol.

6. The process of claim 2, wherein the second etching solution contains 0.3 to 30% by weight of the alkali compound and 7 to 30% by weight of the polyhydric alcohol.

7. The process of claim 1, wherein the fluorine compound is hydrofluoric acid, ammonium fluoride acid ammonium fluoride, or any combination thereof.

8. The process of claim 1, wherein the water-soluble organic solvent is at least one selected from the group consisting of:
an alcohol selected from ethanol, 2-propanol, glycerin, ethylene glycol, and diethylene glycol;
a glycol ether selected from diethylene glycol monomethyl ether, diethylene glycol monobutyl ether, dipropylene glycol monomethyl ether, and dipropylene glycol monopropyl ether;
an amide selected from N,N-dimethylformamide, N,N-dimethylacetamide, and N-methyl-2-pyrrolidone; and
dimethyl sulfoxide.

9. The process of claim 1, wherein the etching solution further comprises an acid.

10. The process of claim 9, wherein the acid is at least one selected from the group consisting of:
an inorganic acid selected from hydrochloric acid, nitric acid, sulfuric acid, and phosphoric acid; and
an organic acid selected from acetic acid, propionic acid, oxalic acid, and methanesulfonic acid.

11. The process of claim 9, wherein a concentration of the acid in the etching solution is 5% by weight or less.

12. The process of claim 9, wherein the concentration of the acid in the etching solution is 3% by weight or less.

13. The process of claim 9, wherein the concentration of the acid in the etching solution is 2% by weight or less.

14. The process of claim 1, wherein the high dielectric material forming the high dielectric material film is $HfO_2$, HfSiO, HfSiON, HfLaO, HfLaON, HfTiSiON, HfAlSiON, HfZrO, or $Al_2O_3$.

15. The process of claim 1, wherein the etching solution contains 0.1 to 5% by weight of the fluorine compound and 30 to 80% by weight of the water-soluble organic solvent.

16. The process of claim 1, wherein the etching solution contains 0.2 to 2% by weight of the fluorine compound and 40 to 80% by weight of the water-soluble organic solvent.

* * * * *